United States Patent
Blümel

(10) Patent No.: US 8,044,474 B2
(45) Date of Patent: Oct. 25, 2011

(54) OPTOELECTRONIC MODULE, AND METHOD FOR THE PRODUCTION THEREOF

(75) Inventor: Simon Blümel, Schierling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 183 days.

(21) Appl. No.: 10/585,175

(22) PCT Filed: Oct. 26, 2004

(86) PCT No.: PCT/DE2004/002385
§ 371 (c)(1),
(2), (4) Date: Jul. 6, 2007

(87) PCT Pub. No.: WO2005/064626
PCT Pub. Date: Jul. 14, 2005

(65) Prior Publication Data
US 2007/0274636 A1    Nov. 29, 2007

(30) Foreign Application Priority Data
Dec. 30, 2003 (DE) .................. 103 61 650

(51) Int. Cl.
*H01L 33/00* (2010.01)
*H01L 31/0232* (2010.01)
*H01L 23/02* (2006.01)

(52) U.S. Cl. ............ 257/432; 257/433; 257/98; 257/99; 257/100; 257/680

(58) Field of Classification Search .................. 438/432
See application file for complete search history.

(56) References Cited

U.S. PATENT DOCUMENTS

| | | | |
|---|---|---|---|
| 4,055,761 A * | 10/1977 | Shimomura | 250/239 |
| 4,168,102 A | 9/1979 | Chida et al. | |
| 4,610,746 A | 9/1986 | Broer et al. | |
| 4,695,871 A | 9/1987 | Tsunoda et al. | |
| 4,971,930 A * | 11/1990 | Fusaroli et al. | 438/116 |
| 5,040,868 A | 8/1991 | Waitl et al. | |

(Continued)

FOREIGN PATENT DOCUMENTS
DE        33 31 451 C2     1/1991

(Continued)

OTHER PUBLICATIONS

Korean Examination Report issued in the corresponding foreign application No. 10-2006-7015393.

*Primary Examiner* — Charles Garber
*Assistant Examiner* — Pape Sene
(74) *Attorney, Agent, or Firm* — Cozen O'Connor

(57) ABSTRACT

An optoelectronic module having a carrier element, at least one semiconductor component for emitting or detecting electromagnetic radiation, said semiconductor component being applied on the carrier element and being electrically conductively connected and having a radiation coupling area, and also at least one optical device assigned to the semiconductor component. A connecting layer made of a radiation-transmissive, deformable material is arranged between the radiation coupling area and the optical device, the optical device and the semiconductor component being fixed relative to one another in such a way that they are pressed against one another and that the connecting layer is thereby squeezed in such a way that it generates a force that strives to press the optical device and the radiation coupling area apart.

17 Claims, 1 Drawing Sheet

U.S. PATENT DOCUMENTS

| | | | |
|---|---|---|---|
| 5,153,734 A | 10/1992 | Kanamori et al. | |
| 5,403,978 A | 4/1995 | Drabek et al. | |
| 5,556,809 A * | 9/1996 | Nakagawa et al. | 438/64 |
| 5,821,532 A * | 10/1998 | Beaman et al. | 250/239 |
| 5,920,120 A | 7/1999 | Webb et al. | |
| 5,959,316 A * | 9/1999 | Lowery | 257/98 |
| 5,981,945 A * | 11/1999 | Spaeth et al. | 250/239 |
| 6,121,675 A * | 9/2000 | Fukamura et al. | 257/680 |
| 6,130,448 A * | 10/2000 | Bauer et al. | 257/222 |
| 6,188,841 B1 * | 2/2001 | Kamata | 396/6 |
| 6,274,890 B1 * | 8/2001 | Oshio et al. | 257/98 |
| 6,441,402 B2 * | 8/2002 | Nakanishi et al. | 257/81 |
| 6,455,774 B1 * | 9/2002 | Webster | 174/521 |
| 6,576,930 B2 * | 6/2003 | Reeh et al. | 257/98 |
| 6,627,872 B1 * | 9/2003 | FuKamura et al. | 250/239 |
| 6,812,500 B2 * | 11/2004 | Reeh et al. | 257/98 |
| 6,888,168 B2 | 5/2005 | Fjelstad | |
| 6,924,514 B2 * | 8/2005 | Suenaga | 257/98 |
| 7,059,040 B1 * | 6/2006 | Webster et al. | 29/831 |
| 7,091,571 B1 * | 8/2006 | Park et al. | 257/432 |
| 7,166,907 B2 * | 1/2007 | Onishi et al. | 257/680 |
| 2002/0057057 A1 * | 5/2002 | Sorg | 313/512 |
| 2002/0190262 A1 * | 12/2002 | Nitta et al. | 257/99 |
| 2003/0116769 A1 | 6/2003 | Song et al. | |
| 2003/0136968 A1 | 7/2003 | Fjelstad | |
| 2003/0185526 A1 | 10/2003 | Höhn et al. | |
| 2005/0001228 A1 * | 1/2005 | Braune et al. | 257/99 |

FOREIGN PATENT DOCUMENTS

| | | |
|---|---|---|
| DE | 100 23 353 A1 | 11/2001 |
| EP | 1 022 787 A1 | 5/1989 |
| EP | 1 022 787 | 7/2000 |
| JP | 60-087306 | 5/1985 |
| JP | 61 214566 A | 9/1986 |
| JP | 2605174 | 9/1991 |
| JP | 06-218627 | 8/1993 |
| JP | 07 122585 | 5/1995 |
| JP | 10 222080 A | 11/1998 |
| JP | 2003-234008 | 8/2003 |
| TW | 479378 | 3/2002 |
| TW | 495936 | 7/2002 |
| TW | 527017 | 4/2003 |

* cited by examiner

OPTOELECTRONIC MODULE, AND METHOD FOR THE PRODUCTION THEREOF

RELATED APPLICATIONS

This is a U.S. national stage of application No. PCT/DE2004/002385, filed on 26 Oct. 2004.

This patent application claims the priority of German patent application no. 103 61 650.0 filed Dec. 30, 2003, the disclosure content of which is hereby incorporated by reference.

FIELD OF THE INVENTION

The invention relates to an optoelectronic module with a carrier element, a semiconductor component on the carrier element, and an optical device assigned to the semiconductor component, and to a method for producing such an optoelectronic module.

BACKGROUND OF THE INVENTION

In many applications with semiconductor components for emitting or detecting electromagnetic radiation, additional optical devices are used for shaping said electromagnetic radiation. Significant losses of radiation intensity often occur in this case on account of reflections between the semiconductor component and the optical device. This relates in particular to reflections at interfaces between the semiconductor component and the optical device.

In order to avoid such reflections to the greatest possible extent, it is important for the optical device to be optically connected as well as possible to the semiconductor component, for which purpose it is necessary to avoid in particular large jumps in refractive index along the beam path. It is known to use gels having a correspondingly adapted refractive index for this purpose, said gels filling interspaces between the semiconductor component and the optical device along the beam path.

One disadvantage when using such gels is that a special manufacturing technology using a special metering installation is necessary for the application of a gel, which causes a significant additional technical effort. Moreover, gels can easily be deformed irreversibly and are thus suitable only to a limited extent for many non-static applications wherein mechanical strain on the component such as vibrations may occur.

SUMMARY OF THE INVENTION

One object of the present invention is to provide an optoelectronic module of the type mentioned above which has an improved optical connection between the semiconductor component and the optical device.

Another object is to provide a simple and cost-effective method for producing such an optoelectronic module.

These and other objects are attained in accordance with one aspect of the present invention directed to an optoelectronic module, comprising a carrier element having electrical connection electrodes and electrical lines, at least one semiconductor component for emitting or detecting electromagnetic radiation, said semiconductor component being applied on the carrier element and being electrically connected to connection electrodes of the carrier element and having a radiation coupling area, and at least one optical device assigned to the semiconductor component. A connecting layer made of a radiation-transmissive, deformable material is arranged in a gap between the radiation coupling area and the optical device. The optical device and the semiconductor component are fixed relative to one another in such a way that they are pressed against one another and that the connecting layer is thereby squeezed in such a way that it generates a force that strives to press the optical device and the radiation coupling area apart.

A "radiation coupling area" is to be understood as a radiation out-coupling area and/or a radiation in-coupling area, i.e. an area of the semiconductor component via which radiation is coupled out from the semiconductor component or coupled into the semiconductor component.

In the context of the invention, "pressed against one another" means that the optical device and the semiconductor component are held permanently in a state pressed against one another, counter to the force of the connecting layer, by a fixing device, as a result of which a deforming force acts on the connecting layer.

The force of the connecting layer counteracts the deforming force. When the deforming force is removed, i.e. when the relative fixing between optical device and semiconductor component is removed, the force of the connecting layer has the effect that the optical device and the semiconductor component are pressed apart.

The connecting layer is configured in such a way that the force that it generates prevents to the greatest possible extent any formation of air gaps between the connecting layer and the adjoining interfaces. This applies in particular to an entire operating temperature range of the module and to any action of additional deforming forces on the connecting layer, such as, for instance, vibrations or centrifugal forces.

Accordingly the connecting layer comprises in particular material which has a higher strength than a conventional gel and which is not flowable over the entire operating temperature range of the optoelectronic module.

The invention can effectively compensate for fluctuations in a distance between the semiconductor component and the optical device which may occur for example in the event of temperature fluctuations in combination with materials of the semiconductor component and the optical device having different expansion coefficients. If the distance increases, for instance, the compressed connecting layer expands and thus minimizes the risk of an air gap forming between the semiconductor component and the radiation coupling area.

The optical device has the purpose of at least partly deflecting electromagnetic radiation that is emitted or received by the semiconductor component. It may be, for instance, a lens for compressing or expanding a cone of the electromagnetic radiation, or a prism, by way of example.

In one advantageous embodiment of the optoelectronic module, the connecting layer has a minimum thickness of 30 µm, preferably of 100 µm. The connecting layer particularly preferably has a thickness of greater than or equal to 150 µm and less than or equal to 350 µm. Such a thickness is advantageous in order that the semiconductor component and the optical device can be pressed against the connecting layer in such a way that no air gap remains between them and the connecting layer generates a force that is strong enough that distance fluctuations and expansion differences can be compensated for in the best possible manner.

The connecting layer preferably has a lacquer, particularly preferably a circuit board lacquer, in which case a "circuit board lacquer" is to be understood as a lacquer which is suitable as a protective lacquer for printed circuit boards. In contrast to a use of a gel, the use of a suitable circuit board lacquer makes it possible to have recourse to the standard lacquering process, as a result of which the manufacturing effort and also the manufacturing costs can be significantly reduced.

In a further advantageous embodiment, a surface of the carrier element is at least partly coated for protection against external influences with a material that is also contained in the connecting layer. A suitable circuit board lacquer may expediently be used for this, that is to say that the circuit board lacquer is applied both on a surface of the carrier element and between the semiconductor component and the optical device. Costs can be saved as a result since two functions are fulfilled by one material layer.

In a particularly expedient embodiment of the module, a refractive index of the connecting layer is adapted to a refractive index of a material of the semiconductor component that adjoins the connecting layer and/or to a refractive index of a material of the optical device that adjoins the connecting layer.

The optical device advantageously has refractive and/or reflective elements.

The semiconductor component is particularly preferably a luminescence diode component. In one advantageous embodiment, the component is a surface-mountable semiconductor component.

One aspect of the invention is directed to a method for producing an optoelectronic module having at least the method steps of providing a carrier element having electrical connection electrodes and electrical lines, providing a semiconductor component for emitting or detecting electromagnetic radiation, said semiconductor component having a radiation coupling area, providing an optical device, applying the semiconductor component on the carrier element and electrically connecting the semiconductor component to the connection electrodes, and mounting the optical device above the radiation coupling area of the semiconductor component. Prior to mounting the optical device, a curable and—in the cured state—radiation-transmissive and deformable composition is applied at least over the radiation coupling area of the semiconductor component. Afterward, the applied composition is at least partly cured or let to be cured. In a further method step, the optical device and the semiconductor component are fixed relative to one another in such a way that they are pressed against one another and the composition is thereby squeezed in such a way that it generates a force that strives to press the optical device and the radiation coupling area apart.

With regard to the expression "pressed against one another", the explanation stated above in connection with the optoelectronic module holds true in connection with the method as well. The same applies to the subject matter of the deformable composition.

The composition is expediently applied in the form of a layer having a minimum thickness of 30 μm, preferably of 100 μm. The composition is particularly preferably applied in the form of a layer having a thickness of greater than or equal to 150 μm and less than or equal to 350 μm.

The composition preferably has a lacquer, particularly preferably a circuit board lacquer, which is deformable, for example elastically deformable to the greatest possible extent, in a cured state. As already mentioned above, a lacquer, in particular a circuit board lacquer, can be applied significantly more cost-effectively and with a significantly lower effort than a gel, for instance.

In a particularly expedient embodiment of the method, the composition is applied at least to part of a surface of the carrier element for protection against external influences. This can be realized particularly expediently with a lacquer, in particular with a circuit board lacquer.

In a particularly advantageous manner, the composition is applied to the radiation coupling area and to the surface of the carrier element in a single method step.

DETAILED DESCRIPTION OF THE DRAWINGS

Identical or identically acting constituent parts are provided with the same reference symbols in the exemplary embodiments and figures, respectively. The elements illustrated in the figures are not to be regarded as true to scale, but rather may be illustrated in part with an exaggerated size in order to afford a better understanding.

Figure 1:
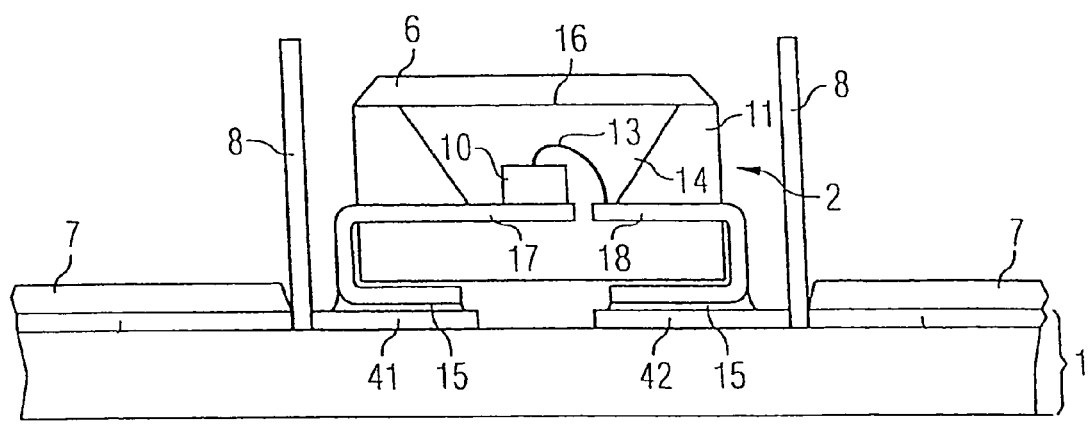
FIG. 1 shows a part of a schematic sectional view of an optoelectronic module at one method stage of an exemplary embodiment of the method.

The part of the optoelectronic module illustrated in FIG. 1 has a carrier element 1, on which a semiconductor component 2 is applied. The carrier element comprises electrical connection electrodes 41, 42, to which the semiconductor component 2 is electrically conductively connected by housing connection lines 17, 18, respectively, by means of a solder 15.

The semiconductor component is a light-emitting component, by way of example. It has a housing basic body 11, to which a light-emitting diode chip 10 is mounted in such a way that its electrical connection sides are electrically conductively connected to the housing connection lines 17, 18. By way of example, a rear side of the light-emitting diode chip 10 is soldered onto a first housing connection line 17 and a front side is electrically conductively connected to a second housing connection line 18 by means of a bonding wire 13. The light-emitting diode chip 10 is encapsulated with a casting compound 14, whose outer surface remote from the housing forms a radiation coupling area 16, via which light generated during the operation of the semiconductor component 2 is coupled out from the latter.

As an alternative, the semiconductor component 2 may for example also be a detector for electromagnetic radiation. In this case, electromagnetic radiation that is incident on the semiconductor component 2 is correspondingly coupled into the semiconductor component 2 at the radiation coupling area 16.

Semiconductor components of this type are generally known to a person skilled in the art and are therefore not described any further here.

The optoelectronic module may have only one or else a plurality of such semiconductor components 2 for emitting or detecting electromagnetic radiation. In addition, further components of different type such as, for instance, resistors, capacitors and/or inductances may also be applied on the carrier element 1 and/or be electrically conductively connected thereto.

A radiation-transmissive, deformable composition in the form of a layer is applied both on parts of the surface of the carrier element 1 and on the radiation coupling area 16 of the semiconductor component 2.

On the surface of the carrier, said layer serves as a protective layer 7 and may in this case also be applied to possibly present components of different type which have already been mentioned above. It protects the surface of the carrier and, if appropriate, the components of different type against external influences.

On the surface of the semiconductor component 2, the layer serves as a connecting layer 6, by means of which the semiconductor component and an optical device 3 arranged above the radiation coupling area 16 (see FIG. 2) can be optically connected to one another.

The protective layer 7 and the connecting layer 6 are for example made of an identical material, for example a suitable circuit board lacquer, and are for example both applied in a single method step. As a result, for instance by means of a standard process of circuit board lacquering, not only the protective layer 7 but also simultaneously the connecting layer 6 are advantageously produced without significant additional effort.

A suitable circuit board lacquer is radiation-transmissive, deformable in a cured state and can, moreover, preferably be applied in a sufficiently thick layer in order that the optical element 3 can be pressed against the connecting layer 6 in such a way that the connecting layer is deformed and that there is no air gap between the optical element 3 and the connecting layer.

The connecting layer has for example a thickness of 300 μm and comprises for example a silicone lacquer. The thick-film lacquer DSL 1706 FLZ from Lackwerke Peters GmbH & Co KG, for instance, is suitable for this purpose. It is based on polyorganosiloxane and has fast condensation crosslinking at room temperature.

For a good optical connection of the semiconductor component 2 and the optical device 3, the refractive index of the material of the connecting layer 6 is adapted to the greatest possible extent to the refractive indices of the casting compound 14 and the optical device 3, i.e. it is approximately equal to them, or, if the refractive indices of the casting compound 14 and the optical device 3 differ significantly from one another, the refractive index of the material of the connecting layer 6 lies between them.

After the connecting layer 6 has cured, an optical device 3 is mounted above the radiation coupling area 16 of the semiconductor component 2 in such a way that the connecting layer 6 is squeezed. For this purpose, the carrier element 1 has for example two or more mounting bars 8 having a thread which project perpendicular to a main plane of extent of the carrier element 1.

The optical device 3 is for example an optical convex lens having lateral extensions into which holes are introduced. The optical device is mounted in such a way that the mounting bars 8 are passed through the holes. The optical device is subsequently fixed by means of nuts 9, so that it is pressed against the connecting layer, which is indicated by arrows at the optical device in FIG. 2. The connecting layer is thereby compressed or squeezed together. In the deformed state, the connecting layer 6 is, moreover, pressed apart somewhat in its main plane of extent (compare FIG. 1 with FIG. 2).

Figure 2:
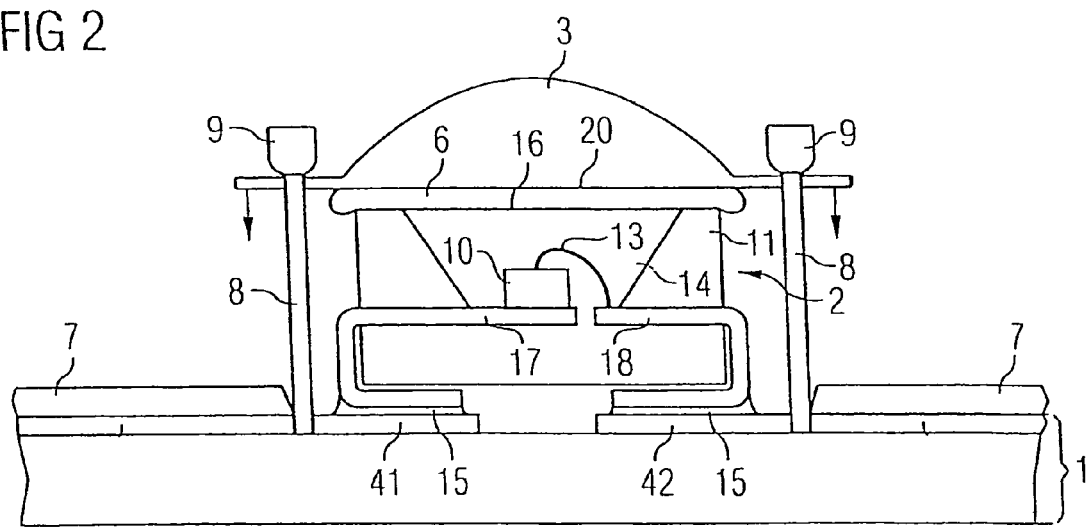
FIG. 2 shows a part of a schematic sectional view of an exemplary embodiment of the optoelectronic module.

The optical device may have refractive and/or reflective elements as an alternative to the lens illustrated in FIG. 2.

Moreover, it is possible also to apply the connecting layer to the side 20 of the optical device 3 facing the semiconductor component and to mount the optical device together with the connecting layer 6 over the radiation coupling area 16. However, it is preferred firstly to apply the connecting layer 6 over the radiation coupling area 16 and afterwards to mount the optical device 3 over the connecting layer 6.

There may additionally be further elements arranged between the connecting layer 6 and the radiation coupling area 16 or the optical device 3, i.e. the connecting layer needs not necessarily be directly adjacent to the radiation coupling area 16 or the optical device 3.

The scope of protection of the invention is not restricted by the description of the invention on the basis of the exemplary embodiments. Rather, the invention encompasses any new feature and also any combination of features, which in particular comprises any combination of features in the patent claims, even if this combination is not explicitly specified in the patent claims.

The invention claimed is:

1. An optoelectronic module, comprising: a housing, a carrier element having electrical connection electrodes and electrical lines; at least one semiconductor component for emitting or detecting electromagnetic radiation, said semiconductor component being applied on the carrier element, being electrically connected to connection electrodes of the carrier element and being encapsulated with a casting compound whose outer surface forms a radiation coupling area, wherein the outer surface is remote from the housing; at least one optical device assigned to the semiconductor component; and a connecting layer made of a radiation-transmissive, deformable material arranged in a gap between the radiation coupling area of the semiconductor component and the optical device, the connecting layer being at least partly cured, wherein after the connecting layer is applied, the optical device and the semiconductor component are fixed relative to one another and pressed against one another, thereby squeezing the at least partly cured connecting layer arranged therebetween, wherein the connecting layer contacts both the radiation coupling area of the semiconductor component and the optical device, and wherein the squeezed connecting layer generates an opposing force that strives to press the optical device and the radiation coupling area of the semiconductor component apart.

2. The optoelectronic module of claim 1, wherein the connecting layer has a thickness of at least 30 μM.

3. The optoelectronic module of claim 2, wherein the connecting layer has a thickness of greater than or equal to 150 μm and less than or equal to 350 μm.

4. The optoelectronic module of claim 1, wherein the connecting layer has a lacquer, preferably a circuit board lacquer, which is deformable in a cured state.

5. The optoelectronic module of claim 1 wherein a surface of the carrier element is at least partly coated for protection against external influences with a material that is also contained in the connecting layer.

6. The optoelectronic module of claim 1, wherein
a refractive index of the connecting layer is adapted to a refractive index of a material of the semiconductor component that adjoins the connecting layer and/or to a refractive index of a material of the optical device that adjoins the connecting layer.

7. The optoelectronic module of claim 1, wherein the optical device has refractive and/or reflective elements.

8. The optoelectronic module of claim 1, wherein the semiconductor component is a luminescence diode component.

9. The optoelectronic module of claim 1, wherein the semiconductor component is a surface-mountable component.

10. A method for producing an optoelectronic module comprising the steps of: providing a housing, providing a carrier element having electrical connection electrodes and electrical lines; providing a semiconductor component for emitting or detecting electromagnetic radiation, said semiconductor component being encapsulated with a casting compound whose outer surface forms a radiation coupling area, wherein the outer surface is remote from the housing; providing an optical device; applying the semiconductor component on the carrier element and electrically connecting the semiconductor component to the connection electrodes; mounting the optical device above the radiation coupling area of the semiconductor component; and prior to mounting the optical device, applying a curable and, when in a cured state, a radiation-transmissive and deformable composition at least over the radiation coupling area of the semiconductor component, wherein the applied composition is at least partly cured or let to be cured, and wherein, after the composition is applied, the optical device and the semiconductor component are fixed relative to one another and pressed against one another, thereby squeezing the at least partly cured composition disposed therebetween, wherein the composition contacts both the radiation coupling area of the semiconductor component and the optical device; and wherein the squeezed applied composition, generates an opposing force that strives to press the optical device and the radiation coupling area apart.

11. The method of claim 10, wherein the composition is applied in the form of a layer having a thickness of at least 30 µm.

12. The method of claim 11, wherein the composition is applied in the form of a layer having a thickness of greater than or equal to 150 µm and less than or equal to 350 µm.

13. The method of claim 10, wherein the composition has a lacquer, preferably a circuit board lacquer, which is deformable in a cured state.

14. The method of claim 10, wherein the composition is applied at least to a part of a surface of the carrier element for protection against external influences.

15. The method of claim 14, wherein the composition is applied to the radiation coupling area and to the surface of the carrier element in a single method step.

16. The optoelectronic module of claim 2, wherein the connecting layer has a thickness of at least 100 µm.

17. The method of claim 11, wherein the composition is applied in the form of a layer having a thickness of at least 100 µm.

\* \* \* \* \*